(12) United States Patent
Yamamoto et al.

(10) Patent No.: US 7,623,380 B2
(45) Date of Patent: Nov. 24, 2009

(54) NONVOLATILE SEMICONDUCTOR MEMORY DEVICE

(75) Inventors: Yasue Yamamoto, Osaka (JP); Yasuhiro Agata, Osaka (JP); Masanori Shirahama, Shiga (JP); Toshiaki Kawasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 395 days.

(21) Appl. No.: 11/526,057

(22) Filed: Sep. 25, 2006

(65) Prior Publication Data

US 2007/0070707 A1    Mar. 29, 2007

(30) Foreign Application Priority Data

Sep. 29, 2005 (JP) .............................. 2005-284165
Jul. 21, 2006 (JP) .............................. 2006-199142

(51) Int. Cl.
*G11C 16/04* (2006.01)
(52) U.S. Cl. .............................. 365/185.1; 365/185.01; 365/185.33
(58) Field of Classification Search ............ 365/185.18, 365/185.13, 188, 187, 185.1, 185.01, 185.33
See application file for complete search history.

(56) References Cited

U.S. PATENT DOCUMENTS

| | | | |
|---|---|---|---|
| 5,301,150 A | | 4/1994 | Sullivan et al. |
| 5,844,300 A | * | 12/1998 | Alavi et al. .................. 257/532 |
| 6,191,980 B1 | | 2/2001 | Kelley et al. |
| 6,214,666 B1 | * | 4/2001 | Mehta .......................... 438/257 |
| 6,232,631 B1 | * | 5/2001 | Schmidt et al. ............. 257/315 |
| 6,326,663 B1 | * | 12/2001 | Li et al. ....................... 257/318 |
| 6,570,212 B1 | * | 5/2003 | Mehta et al. ................. 257/315 |
| 2006/0067124 A1 | | 3/2006 | Lee et al. |
| 2006/0209598 A1 | * | 9/2006 | Wang et al. ............. 365/185.28 |
| 2007/0247915 A1 | * | 10/2007 | Kalnitsky et al. ...... 365/185.18 |

OTHER PUBLICATIONS

Richard J. McPartland, et al., "1.25 Volt, Low Cost, Embedded Flash Memory for Low Density Applications", 2000 Symposium on VLSI Circuits Digest of Technical Papers, pp. 158-161.

* cited by examiner

*Primary Examiner*—Vu A Le
*Assistant Examiner*—Han Yang
(74) *Attorney, Agent, or Firm*—McDermott Will & Emery LLP

(57) ABSTRACT

A nonvolatile semiconductor memory device for storing data by accumulating charge in a floating gate includes a plurality of MOS transistors sharing the floating gate. In the device, a PMOS is used for coupling during writing and an n-type depletion MOS (DMOS) is used for coupling during erasure. Coupling of channel inversion capacitance by the PMOS is used for writing and coupling of depletion capacitance by the n-type DMOS is used for erasure, thereby increasing the erase speed without increase of area, as compared to a conventional three-transistor nonvolatile memory element.

17 Claims, 14 Drawing Sheets

NONVOLATILE SEMICONDUCTOR MEMORY DEVICE

BACKGROUND OF THE INVENTION

The present invention relates to nonvolatile semiconductor memory devices. More particularly, the present invention relates to a low-cost nonvolatile semiconductor memory device capable of being embedded in LSI in a leading-edge standard CMOS process.

In recent years, there has been an increasing demand for incorporating secure information such as an encryption key for contents in system LSI in a leading-edge standard CMOS process. For this incorporation, the use of metal fuses has been considered. However, there is apprehension that information leakage might be caused by analysis. To prevent the leakage, inclusion of a nonvolatile semiconductor memory device capable of being rewritten at low cost is expected.

To mount a nonvolatile semiconductor memory device such as a flash memory on system LSI, a dedicated process is additionally needed in a standard CMOS process, so that the process cost increases and no leading-edge process can be used. In view of this, a low-cost nonvolatile semiconductor memory device capable of being embedded in LSI in a leading-edge standard CMOS process is needed.

To meet the need described above, a CMOS nonvolatile memory in which the respective gates of one NMOS and two PMOSs capable of being embedded in LSI in a leading-edge standard CMOS process together form a floating gate, the diffusion region of a first PMOS is used as a control gate during write operation and read operation and the diffusion region of a second PMOS is used during erase operation is known (see, Richard J. McPartland, et al., "1.25 Volt, Low Cost, Embedded FLASH Memory for Low Density Applications", 2000 Symposium on VLSI Circuits Digest of Technical Papers, pp. 158-161).

FIG. 1 is a circuit diagram illustrating a conventional nonvolatile memory element including one NMOS transistor and two PMOS transistors. FIG. 2 is a cross-sectional view of the conventional nonvolatile memory element illustrated in FIG. 1. FIG. 3 is a schematic plan view of the conventional nonvolatile memory element.

In FIG. 1, reference numeral 1 denotes a control gate transistor (a PMOS transistor), reference numeral 2 denotes an erase gate transistor (a PMOS transistor), reference numeral 3 denotes a read transistor (an NMOS transistor), reference numeral 4 denotes a control gate, reference numeral 5 denotes an erase gate, reference numeral 6 denotes a drain terminal of the NMOS transistor, reference numeral 7 denotes a source terminal of the NMOS transistor and reference numeral 8 denotes a p-type silicon substrate terminal. Reference numeral 9 denotes a floating gate (FG) connecting the gates of the PMOS transistors 1 and 2 and the gate of the NMOS transistor 3 together.

As illustrated in FIG. 2, the NMOS transistor 3 is formed in a p-type silicon substrate 10 and includes an n-type charge-carrying region and a gate electrode. The PMOS transistors 1 and 2 are provided in n-wells 12 and 11, respectively, in the p-type silicon substrate 10 and each include a p-type charge-carrying region and a gate electrode. The gate electrode of the NMOS transistor 3 is connected to the gates of the PMOS transistors 1 and 2 through the floating gate (FG) 9 and a given voltage is applied to each terminal, thereby performing writing, reading and erasing of carriers on the floating gate (FG) 9.

The conventional nonvolatile memory element using a standard CMOS process has a drawback in which increase of the write speed causes the area occupied by a memory cell to increase and increase of the erase speed is hindered by the limitation of the minimum process size of an erase gate transistor forming the memory cell. Accordingly, in view of cost and physical limitations, demands for application have not been satisfied because of difficulty in increasing the write speed and the erase speed, for example.

A conventional nonvolatile semiconductor memory device using a standard CMOS process has a drawback in which the number of data rewritings is only 1,000 so that reliability equal to that in a flash memory (i.e., 100,000 data rewritings) is not ensured, for example. It is expected that if increase in capacity and more than 1,000 data rewritings are needed in future, the number of data rewritings in a nonvolatile semiconductor memory device becomes an extremely important factor in terms of cost and reliability.

To increase the write speed and the erase speed, a control gate transistor has a capacitance greater than that of a read transistor. This causes the threshold voltage in a charge-0 state (i.e., an ultimate state after reliability deteriorates) to decrease. Accordingly, to utilize advantages of a differential amplifying memory cell exhibiting excellent data retention characteristics, the threshold voltage in an erase state needs to be set extremely low, so that excessive erasure is likely to occur.

SUMMARY OF THE INVENTION

To solve the foregoing problems, in an aspect of the present invention, a nonvolatile semiconductor memory device for storing data by accumulating charge in a floating gate includes a plurality of MOS transistors sharing the floating gate, wherein one of the MOS transistors for writing uses coupling of channel capacitance for writing and one of the MOS transistors for erasure uses coupling of depletion capacitance for erasure. Then, a nonvolatile semiconductor memory device having increased erase speed is implemented.

If a PMOS is used for the coupling for writing and an n-type depletion MOS (DMOS) is used for the coupling for erasure, write efficiency and erase efficiency are enhanced.

If write operation is performed by applying a high bias to a control gate of a PMOS and an erase gate of a depletion MOS so as to inject electrons by FN (Fowler-Nordheim) tunneling in a read transistor of an NMOS, and erase operation is performed by applying a low bias to the control gate of the PMOS so as to emit electrons by FN tunneling in the depletion MOS, then write and erase current is reduced, so that data is allowed to be written and erased to/from a plurality of bit cells at a time. Accordingly, the write and erase speed is increased.

In another aspect of the present invention, a nonvolatile semiconductor memory device for storing data by accumulating charge in a floating gate includes a plurality of MOS transistors sharing the floating gate, wherein one of the MOS transistors has a first control gate to which a high bias is applied only during writing and reading, and another one of the MOS transistors has a second control gate to which a high bias is applied only during writing. The threshold voltage in a charge-0 state is determined by the first control gate, the potentials according to writing and erasure are adjusted by the second control gate and the erase gate, and the threshold voltage in the charge-0 state is determined simultaneously with high-speed writing and erasure, independently of speed adjustment.

If coupling of channel capacitance is used for writing and coupling of depletion capacitance is used for erasure, a nonvolatile semiconductor memory device having an increased erase speed is implemented. Accordingly, in achieving a desired erase speed, it is possible to reduce a voltage to be applied, so that the number of data rewritings is increased.

If a four-transistor bit cell in which the first control gate is formed by a PMOS, the second control gate is formed by a PMOS, an erase gate is formed by an n-type depletion MOS and a transistor for reading is formed by an NMOS is adopted, writing and erasure are performed at high speed.

In yet another aspect of the present invention, a nonvolatile semiconductor memory device for storing data by accumulating charge in a floating gate includes a plurality of MOS transistors sharing the floating gate, wherein the MOS transistors include: a first MOS transistor formed in an n-well region, one of a source and a drain of the first MOS transistor being formed by a p-type diffusion layer; and a second MOS transistor formed in an n-well region, one of a source and a drain of the second MOS transistor being formed by an n-type diffusion layer. The second MOS transistor is preferably a depletion MOS transistor.

In still another aspect of the present invention, a nonvolatile semiconductor memory device for storing data by accumulating charge in a floating gate includes a plurality of MOS transistors sharing the floating gate, wherein the MOS transistors include: a first MOS transistor formed in an n-well region, one of a source and a drain of the first MOS transistor being formed by a p-type diffusion layer; a second MOS transistor formed in an n-well region, one of a source and a drain of the second MOS transistor being formed by a p-type diffusion layer; a third MOS transistor formed in an n-well region, one of a source and a drain of the third MOS transistor being formed by an n-type diffusion layer; and a fourth MOS transistor formed by an NMOS.

In a nonvolatile semiconductor memory device according to the present invention, the erase speed is increased with the area of a memory element prevented from increasing, as compared to a conventional three-transistor nonvolatile memory element. Accordingly, in achieving an erase speed equal to that in a conventional device, an applied bias is allowed to be reduced, so that the number of data rewritings is increased.

DETAILED DESCRIPTION OF THE INVENTION

Hereinafter, embodiments of the present invention will be described with reference to the drawings.

First, using a three-transistor nonvolatile semiconductor memory device as an example, an optimum structure as a control gate and an optimum structure as an erase gate will be described.

<Description of Control Gate>

Figure 4:
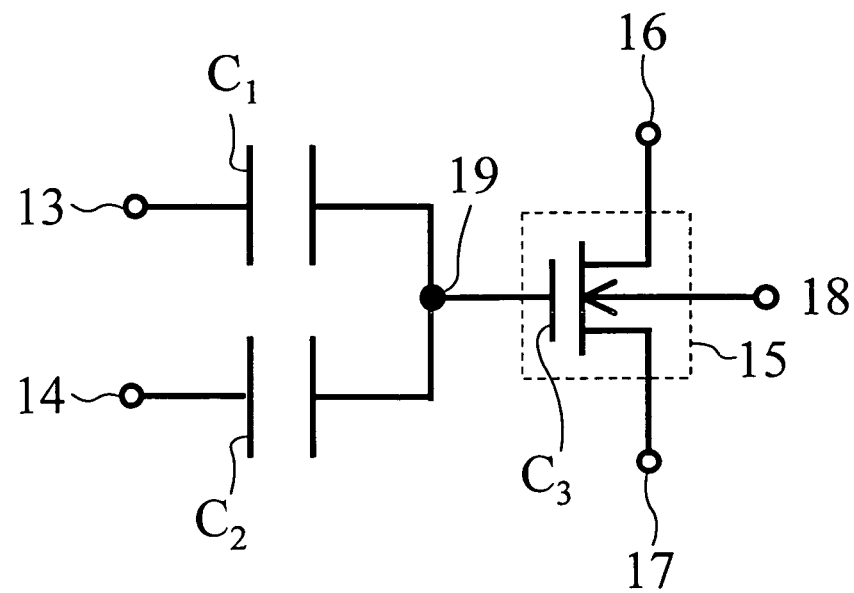
FIG. 4 is a circuit diagram illustrating a three-transistor nonvolatile memory element.

FIG. 4 is a circuit diagram illustrating a three-transistor nonvolatile memory element. In FIG. 4, reference numeral 13 denotes a control gate (CG), reference numeral 14 denotes an erase gate (EG), reference numeral 19 denotes a floating gate (FG), reference numeral 15 denotes a read transistor of an NMOS, reference numeral 16 denotes a drain terminal of the NMOS read transistor, reference numeral 17 denotes a source terminal of the NMOS read transistor, reference numeral 18 denotes a p-type silicon substrate terminal, reference symbol $C_1$ denotes a channel capacitance of the control gate transistor, reference symbol $C_2$ denotes a channel capacitance of the erase gate transistor and reference symbol $C_3$ denotes a channel capacitance of the read transistor.

For write operation, a high bias is applied to the control gate (CG) 13 and the erase gate (EG) 14, the source terminal 16 and the drain terminal 17 are grounded, and electrons are injected into the floating gate (FG) 19 by FN tunneling in the read transistor 15, thereby performing writing. At this time, to enhance the efficiency of electron injection, the capacitance ratio between the control gate transistor (having capacitance $C_1$) and the read transistor (having capacitance $C_3$) needs to be designed to be high. In the three-transistor nonvolatile semiconductor memory device including the control gate transistor, the erase gate transistor and the read transistor in the manner described above, an optimum structure as the control gate transistor will be described. The read transistor is an NMOS in the following example, but is not limited to an NMOS.

First, at the start of writing, the following equations are established by the principle of conservation of charge.

$$Q = C_1 \cdot (V_{FG} - V_{CG}) + C_2 \cdot (V_{FG} - V_{EG}) + C_3 \cdot V_{FG} \quad (1)$$

$$V_{FG} = \frac{(C_1/C_2)V_{CG} + V_{EG}}{1 + (C_1/C_2) + (C_3/C_2)} \quad (2)$$

where Q is charge in the floating gate (FG) 19, $V_{CG}$ is a control gate voltage, $V_{EG}$ is an erase gate voltage, $V_{FG}$ is a floating gate potential, $C_1$ is a channel capacitance of the control gate transistor, $C_2$ is a channel capacitance of the erase gate transistor and $C_3$ is a channel capacitance of the read transistor. Equation (1) is Equation (2) when Q=0. The capacitance ratio ($C_1/C_2$) between $C_1$ and $C_2$ is defined as a and the capacitance ratio ($C_3/C_2$) between $C_3$ and $C_2$ is defined as β.

Figure 5:
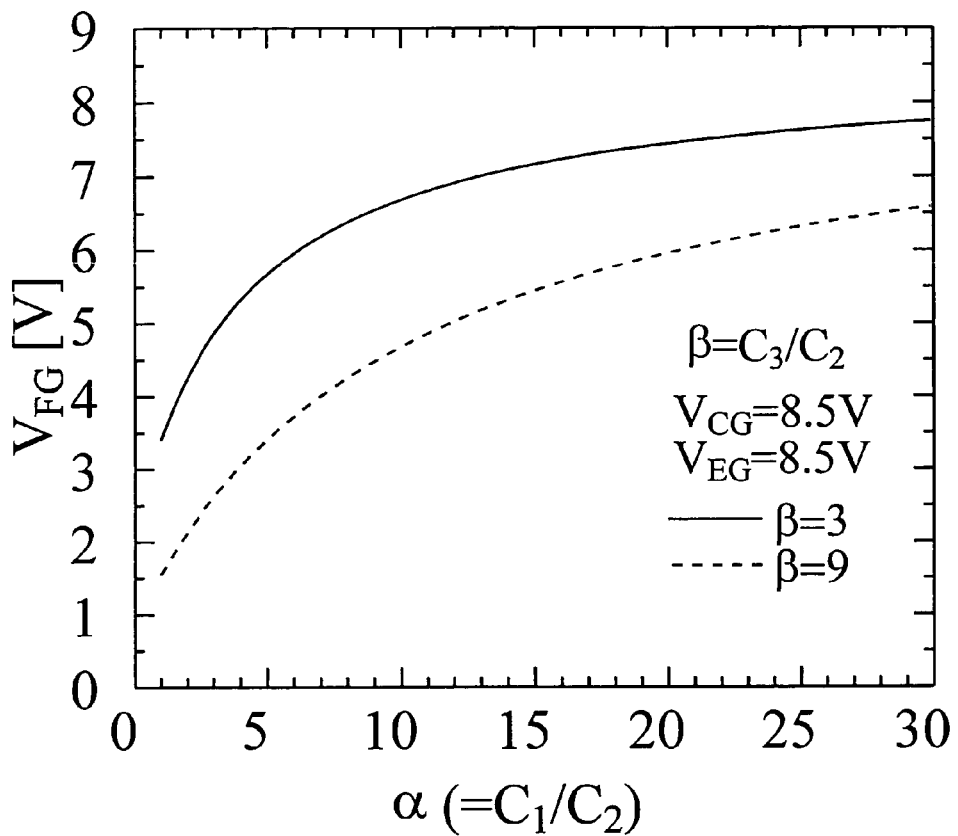
FIG. 5 is a graph showing dependence of a floating gate potential ($V_{FG}$) on capacitance ratio ($\alpha$, $\beta$) during writing of the three-transistor nonvolatile memory element.

FIG. 5 shows dependence of the floating gate potential $V_{FG}$ on the capacitance ratio (α, β) during writing (where $V_{CG}=V_{EG}=8.5V$). As shown in FIG. 5, when $C_1/C_2$ (=α) is set high and $C_3/C_2$ (=β) is set low, $V_{FG}$ is high. This increases a voltage applied between the gate of the NMOS as the read transistor 15 and the p-type silicon substrate terminal 18, so that the erase speed increases.

As the control gate transistor, a PMOS or an n-type depletion MOS (hereinafter, referred to as a DMOS) is possible.

Figure 6:
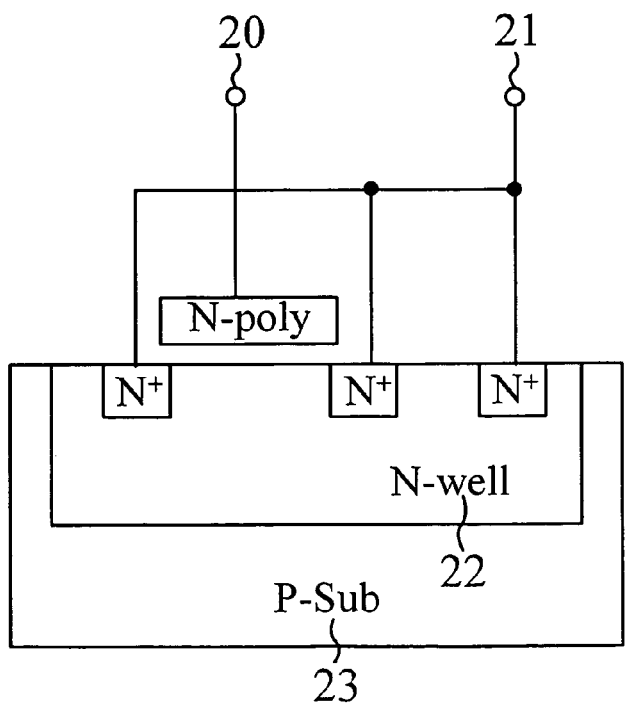
FIG. 6 is a cross-sectional view illustrating an n-type DMOS capacitor.

FIG. 6 is a cross-sectional view illustrating an n-type DMOS capacitor. In FIG. 6, reference numeral 20 denotes a gate terminal of the n-type DMOS capacitor, reference numeral 21 denotes an n-well terminal (i.e., a diffusion-layer terminal) of the n-type DMOS capacitor, reference numeral 22 denotes an n-well region and reference numeral 23 denotes a p-type silicon substrate. The n-type DMOS capacitor illustrated in FIG. 6 is fabricated in a CMOS process without using an additional mask.

Application of an n-type DMOS to the control gate transistor (having capacitance $C_1$) obtains only about ⅓ of the capacitance value of an oxide film because the n-type DMOS operates in a depletion mode during writing. Specifically, the capacitance ratio between the control gate transistor (having capacitance $C_1$) and the read transistor (having capacitance $C_3$) is low, so that the voltage transmitted to the floating gate potential ($V_{FG}$) decreases, resulting in a decrease of the write speed. On the other hand, application of a PMOS to the control gate transistor (having capacitance $C_1$) obtains a channel inversion capacitance because the PMOS operates in an inversion mode, so that the capacitance ratio between the control gate transistor (having capacitance $C_1$) and the read transistor (having capacitance $C_3$) is high. Accordingly, a PMOS is preferably applied as a coupling transistor to the control gate transistor (having capacitance $C_1$) during writing.

<Description on Erase Gate>

As described above, application of a PMOS to the control gate transistor (having capacitance $C_1$) achieves a high efficiency in coupling the control gate (CG) 13 to the floating gate (FG) 19. Then, it will be described which one of a PMOS and an n-type DMOS is preferable as the erase gate transistor (having capacitance $C_2$). The read transistor (having capacitance $C_3$) is an NMOS, but is not limited to an NMOS.

First, during erase operation, the following equations are established by the principle of conservation of charge:

$$Q = C_1 \cdot (V_{FG} - V_{CG}) + C_2 \cdot (V_{FG} - V_{EG}) + C_3 \cdot V_{FG} \quad (3)$$

$$V_{FG} = \frac{C_1 \cdot V_{CG} + C_2 \cdot V_{EG} + Q}{C_1 + C_2 + C_3} \quad (4)$$

$$V_{FG} = \frac{V_{EG} + (Q/C_2)}{1 + (C_1/C_2) + (C_3/C_2)} \quad (5)$$

where $C_1$ is a channel capacitance of the control gate transistor, $C_2$ is a channel capacitance of the erase gate transistor and $C_3$ is a channel capacitance of the read transistor.

When $V_{CG}=0V$, Equation (4) is Equation (5). As shown in Equation (5), when α (=$C_1/C_2$) and β (=$C_3/C_2$) increase, the floating gate potential ($V_{FG}$) decreases. This causes a voltage applied between the floating gate (FG) 19 as the gate of the erase gate transistor (having capacitance $C_2$) and the n-well as the erase gate (EG) 14 to increase, so that the erase speed increases. Suppose 8.5V is applied to the erase gate (EG) 14 and 0V is applied to the control gate (CG) 13, for example, for erasure. When a PMOS is applied to the erase gate transistor (having capacitance $C_2$), the capacitance value is large because the PMOS operates in an inversion mode under this bias condition. On the other hand, when an n-type DMOS is applied to the erase gate transistor (having capacitance $C_2$), the capacitance value is small because the n-type DMOS operates in a depletion mode under this bias condition. Accordingly, the application of the n-type DMOS to the erase gate transistor (having capacitance $C_2$) increases α and β, so that the floating gate voltage ($V_{FG}$) is lower than that in the case of applying a PMOS. Accordingly, a voltage applied between the floating gate (FG) 19 as the gate of the erase gate transistor (having capacitance $C_2$) and the n-well as the erase gate (EG) 14 increases, so that the erase speed increases. At this time, erasure is performed by FN tunneling emission of electrons in the overlapping region between the floating gate (FG) 19 as the gate of the n-type DMOS and the source/drain (S/D) diffusion regions and in the channel region. Therefore, an n-type DMOS is preferably applied to the erase gate transistor (having capacitance $C_2$).

As described above, it is preferable to apply a PMOS and an n-type DMOS to the control gate transistor (having capacitance $C_1$) and the erase gate transistor (having capacitance $C_2$), respectively.

As shown in FIG. 5, with respect to the capacitance ratio during writing, when β≈3 and α>8 to 9, the voltage at the floating gate is allowed to be set high and the efficiency in write operation is high. In this case, channel is formed between the control gate and the erase gate and the capacitance ratio is equal to the gate area ratio. Accordingly, the gate area of the erase gate transistor:the gate area of the read transistor is preferably 1:2 to 4. In addition, the gate area of the erase gate transistor:the gate area of the control gate transistor is preferably 1:8 to 9. As an example, the gate area of the erase gate transistor:the gate area of the read transistor: the gate area of the control gate transistor is preferably 1:3:9. In the case of application of a DMOS to the erase gate, a depletion layer is formed during erase operation, the capacitance ratio≠ the gate area ratio. If the gate area of the erase gate transistor:the gate area of the control gate transistor=1:9, the capacitance ratio is about 1:27, so that the capacitance ratio is efficiently obtained.

Embodiment 1

Figure 1:
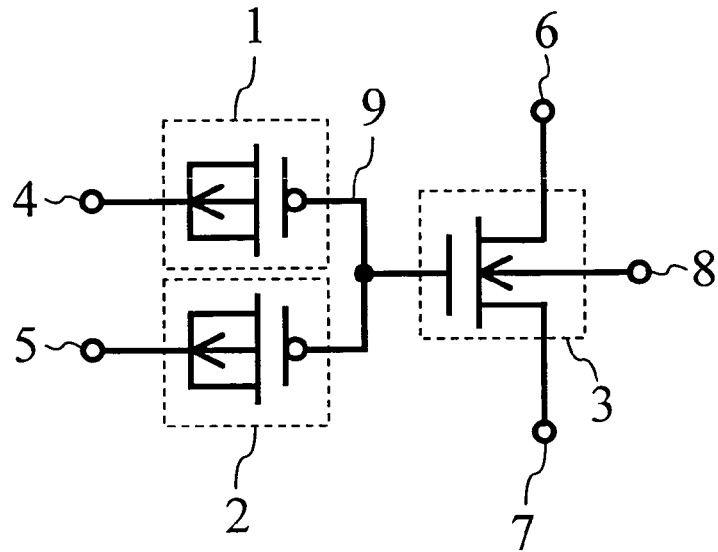
FIG. 1 is a circuit diagram illustrating a conventional nonvolatile memory element.
Figure 7:
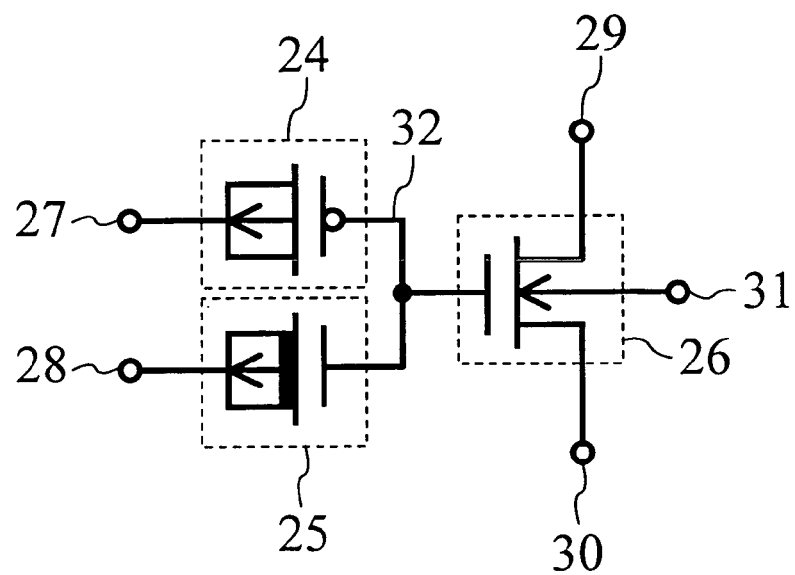
FIG. 7 is a circuit diagram illustrating a nonvolatile memory element according to a first embodiment of the present invention.
Figure 2:
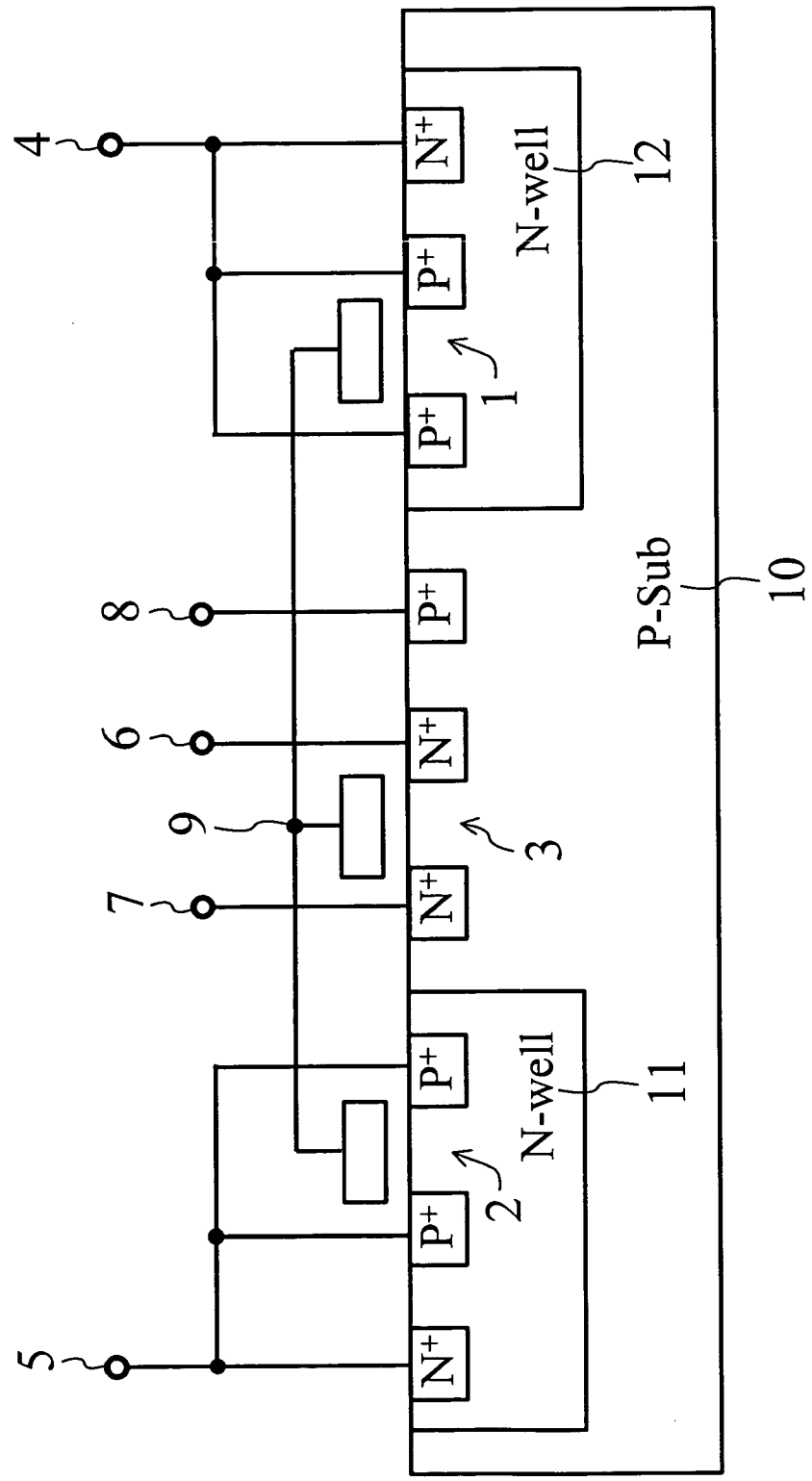
FIG. 2 is a cross-sectional view of the conventional nonvolatile memory element.
Figure 3:
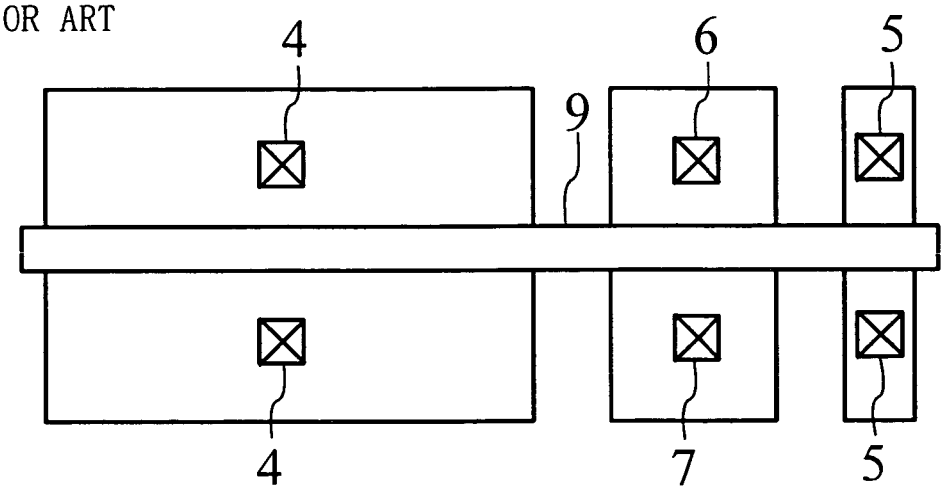
FIG. 3 is a schematic plan view of the conventional nonvolatile memory element.
Figure 8:
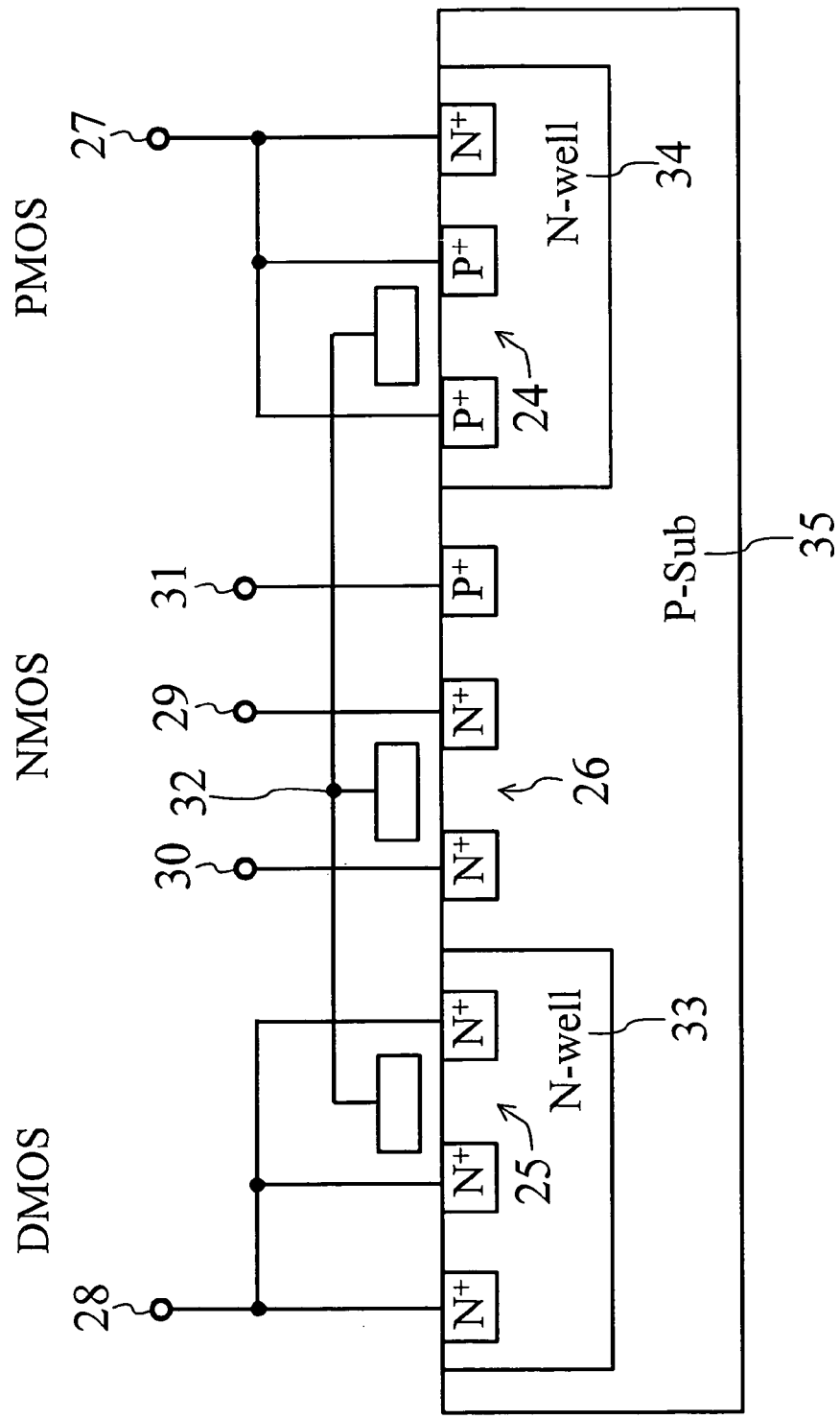
FIG. 8 is a cross-sectional view of the nonvolatile memory element of the first embodiment.

FIG. 7 is a circuit diagram illustrating a nonvolatile memory element according to a first embodiment of the present invention. FIG. 8 is a cross-sectional view of the nonvolatile memory element of the first embodiment. A nonvolatile memory element according to the present invention is constituted by three transistors: a control gate transistor 24 of a PMOS, a read transistor 26 of an NMOS and an erase gate transistor 25 of an n-type DMOS. The nonvolatile memory element of the present invention will be hereinafter referred to as a PMOS-NMOS-DMOS (PND) cell.

In FIG. 7, reference numeral 27 denotes a control gate (CG), reference numeral 28 denotes an erase gate (EG), reference numeral 29 denotes a drain terminal of the NMOS read transistor, reference numeral 30 denotes a source terminal of the NMOS read transistor, reference numeral 31 denotes a p-type silicon substrate terminal and reference numeral 32 denotes a floating gate (FG). In FIG. 8, reference numerals 33 and 34 denote n-well regions and reference numeral 35 denotes a p-type silicon substrate. The polysilicon gates of the PMOS 24, the NMOS 26 and the n-type DMOS 25 are electrically connected together and form the floating gate (FG) 32 of the nonvolatile memory element. The n-well region 34 of the PMOS 24 forms the control gate (CG) 27. The n-well region 33 of the n-type DMOS 25 forms the erase gate (EG) 28. The n-type DMOS 25 is formed by a CMOS process without using an additional mask.

Writing is performed by FN tunneling injection of electrons into the entire channel of the NMOS transistor 26 as the read transistor. Erasure is performed by FN tunneling emission of electrons in the overlapping region between the floating gate (FG) 32 as the gate of the n-type DMOS 25 and the source/drain (S/D) diffusion regions and in the channel region. When the n-type DMOS 25 as the erase gate transistor operates in a depletion mode and the capacitance between the floating gate (FG) 32 and the n-well region 33 of the n-type DMOS 25 is set small (about 28% of accumulated capacitance) during erasure, the voltage applied between the floating gate (FG) 32 and the n-well region 33 of the n-type DMOS 25 increases, so that the erase speed is increased as compared to conventional devices.

Figure 9:
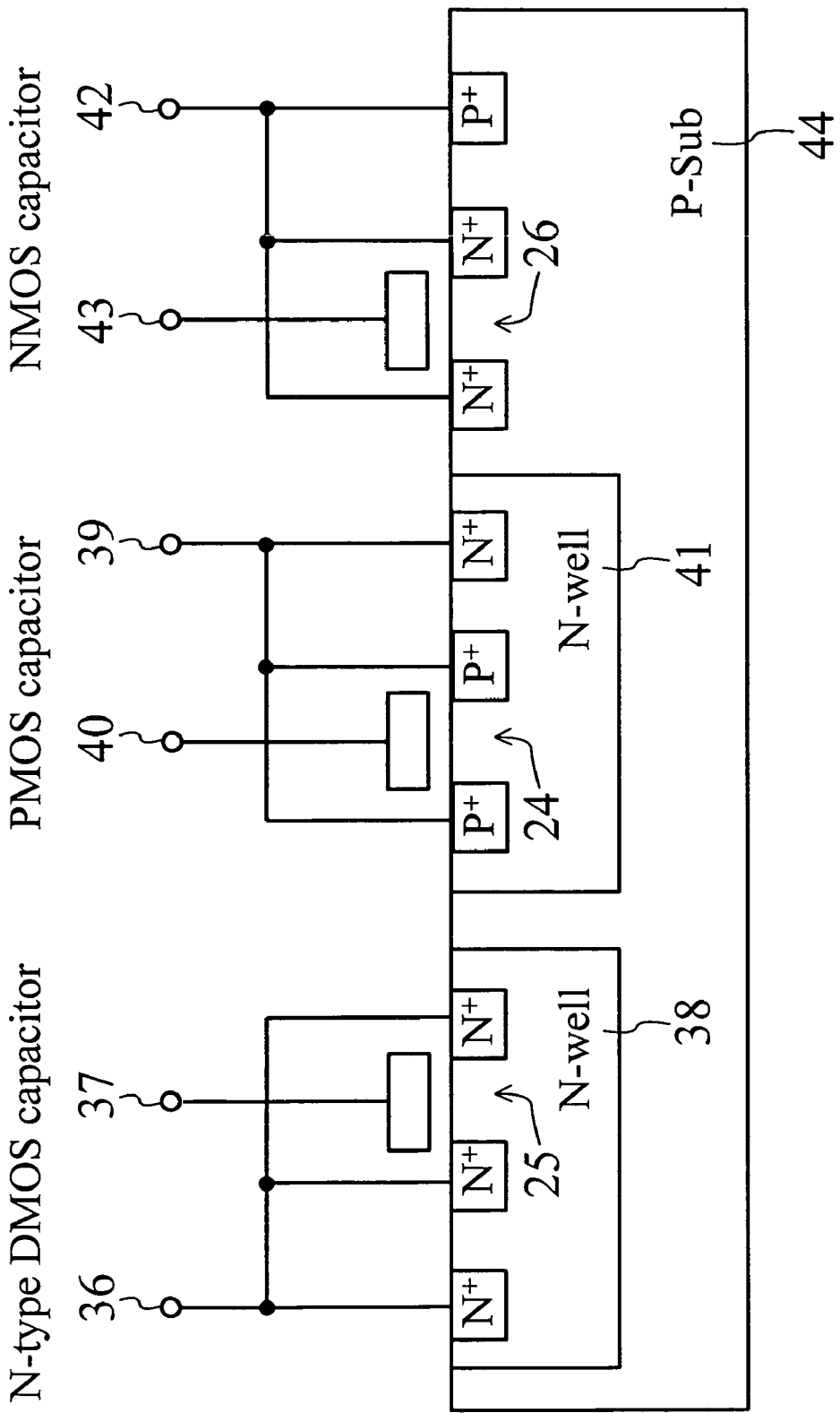
FIG. 9 is a cross-sectional view illustrating an n-type DMOS capacitor, a PMOS capacitor and an NMOS capacitor for measuring C-V characteristics.

FIG. 9 is a cross-sectional view illustrating an n-type DMOS capacitor, a PMOS capacitor and an NMOS capacitor for measuring C-V characteristics. In FIG. 9, reference numeral 36 denotes a well terminal (a diffusion-layer terminal) of the n-type DMOS capacitor, reference numeral 37 denotes a gate terminal of the n-type DMOS capacitor, reference numeral 38 denotes an n-well region, reference numeral 39 denotes a well terminal (a diffusion-layer terminal) of the PMOS capacitor, reference numeral 40 denotes a gate terminal of the PMOS capacitor, reference numeral 41 denotes an n-well region, reference numeral 42 denotes a substrate terminal (a diffusion-layer terminal) of the NMOS capacitor, reference numeral 43 denotes a gate terminal of the NMOS capacitor and reference numeral 44 denotes a p-type silicon substrate.

Figure 10A:
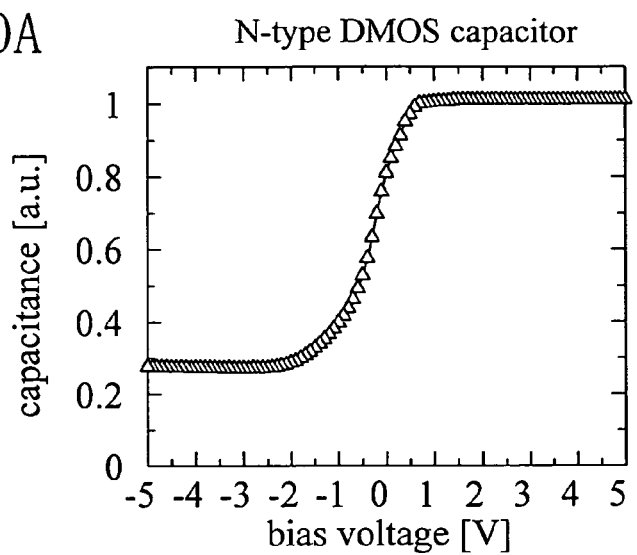
FIGS. 10A, 10B and 10C are graphs showing C-V characteristic of an n-type DMOS capacitor, a PMOS capacitor and an NMOS capacitor, respectively.
Figure 10B:
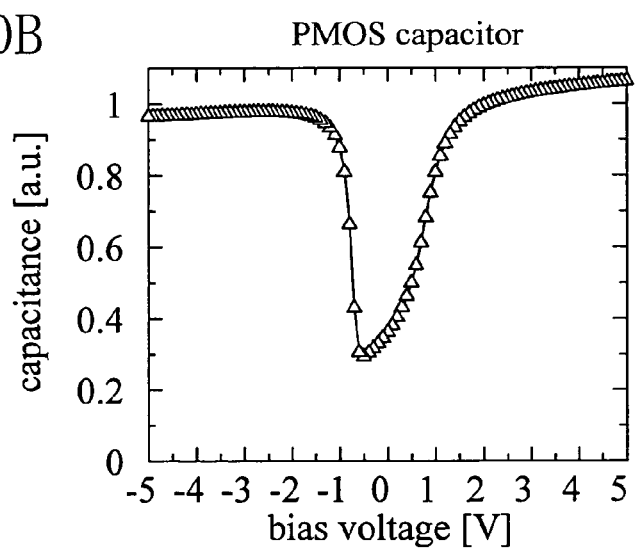
Figure 10C:
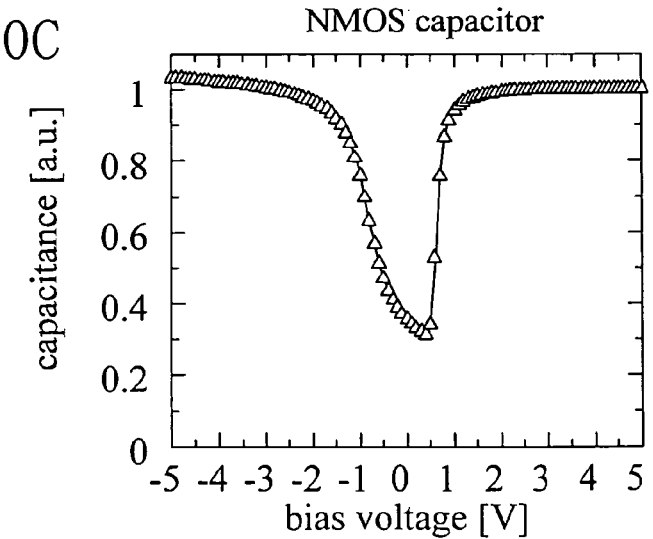

FIGS. 10A, 10B and 10C show measurement results on C-V characteristics of an n-type DMOS capacitor, a PMOS capacitor and an NMOS capacitor forming a PND cell formed by using an I/O transistor at 3.3V in a 110-nm CMOS logic process. In the PMOS capacitor, both electrons and holes are readily supplied from $n^+$ and $p^+$ diffusion regions, so that the C-V curve of the PMOS capacitor differs from that of the n-type DMOS capacitor. In contrast, in the n-type DMOS capacitor, only electrons are supplied from an adjacent $n^+$ diffusion region. As shown by the C-V curve of the PMOS capacitor in FIG. 10B, as the bias voltage increases from −5V to +5V, the silicon surface state under the gate electrode changes from an inversion mode to a depletion mode and then an accumulation mode, so that the capacitance changes from large to small and then large. In contrast, with respect to the C-V curve of the DMOS capacitor shown in FIG. 10A, the silicon surface state changes from a depletion mode to an accumulation mode under the same conditions, so that the capacitance changes from small to large. As shown in FIG. 10A, when the potential difference between the gate terminal 37 of the DMOS capacitor and the n-well terminal 36 is −5V (i.e., a depletion mode), the capacitance is about 28% of the accumulation capacitance. The PND cell utilizes these characteristics.

Embodiment 2

Figure 11:
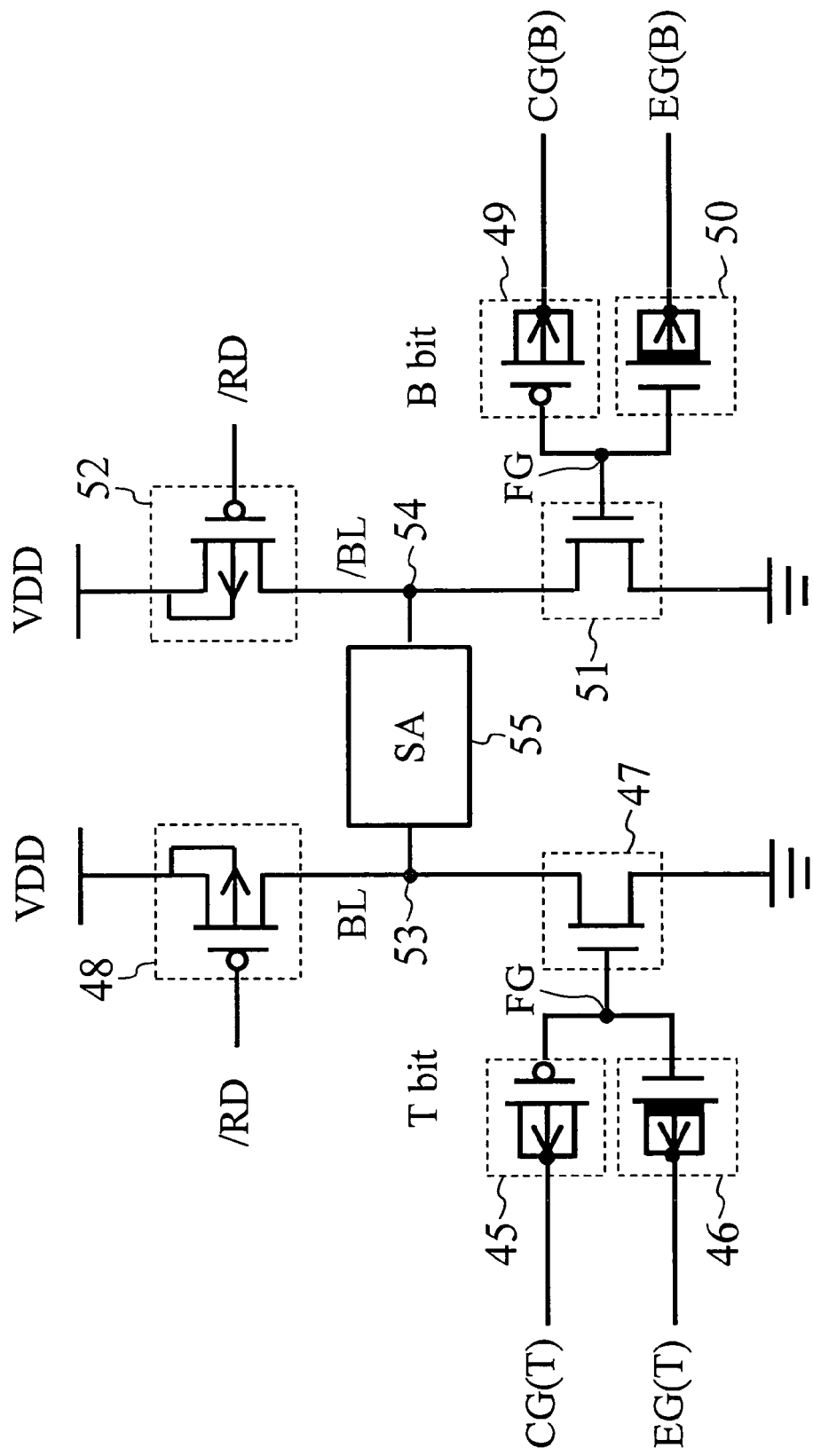
FIG. 11 is a circuit diagram illustrating a nonvolatile semiconductor memory device with a differential cell structure according to a second embodiment of the present invention.

FIG. 11 is a circuit diagram illustrating a nonvolatile semiconductor memory device having a differential cell structure according to a second embodiment of the present invention. One of the two parts forming a differential bit cell is referred to as a T (True) bit and the other is referred to as a B (Bar) bit. In FIG. 11, reference numeral 45 denotes a control gate transistor (a PMOS transistor) in the T bit, reference numeral 46 denotes an erase gate transistor (an n-type DMOS transistor) in the T bit, reference numeral 47 denotes a read transistor (an NMOS transistor) in the T bit, reference numeral 48 denotes a load PMOS transistor, reference numeral 49 denotes a control gate transistor (a PMOS transistor) in the B bit, reference numeral 50 denotes an erase gate transistor (an n-type DMOS transistor) in the B bit, reference numeral 51 denotes a read transistor (an NMOS transistor), reference numeral 52 denotes a load PMOS transistor, reference numeral 53 denotes a bit line (BL), reference numeral 54 denotes a bit line bar (/BL) and reference numeral 55 denotes a sense amplifier.

Figure 12:
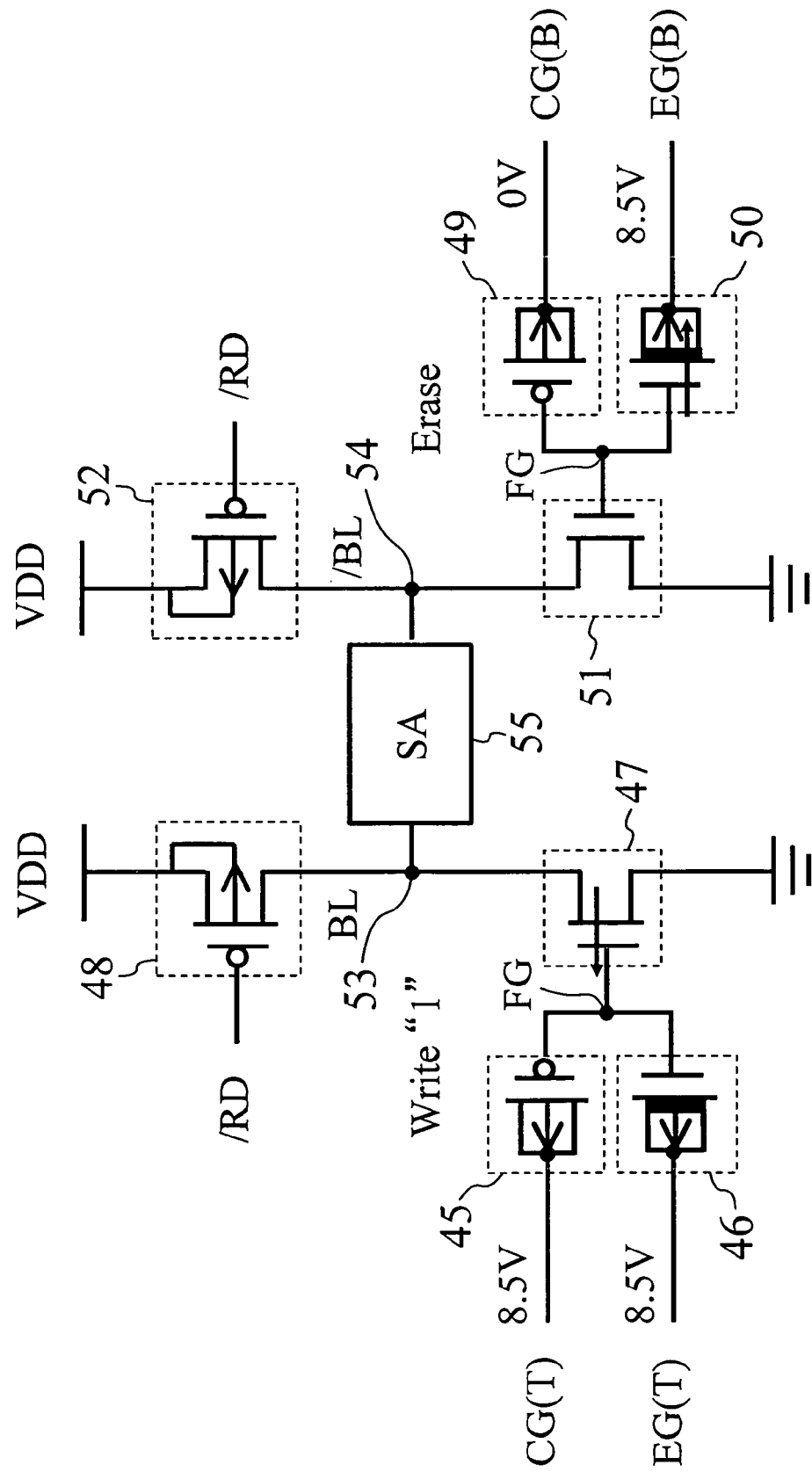
FIG. 12 is a circuit diagram showing write "1" operation of the differential cell structure of the second embodiment.

FIG. 12 is a circuit diagram showing write "1" operation of the differential cell structure of the second embodiment. In the write "1" operation in the differential cell structure, write operation is performed by the T bit and erase operation is performed by the B bit. A power supply voltage VDD is input as a read control signal (/RD) and the load PMOS transistors 48 and 52 are OFF.

First, write operation in the T bit of the PND cell will be described. A voltage of 8.5V is applied to each of a control gate CG (T) and an erase gate EG (T) in the T bit of the PND cell. At this time, the capacitance ratio between the PMOS of the control gate transistor 45 and the NMOS of the read transistor 47 is designed to be high, so that a high voltage around 8.5V is applied to the floating gate (FG) and electrons are injected into the floating gate by FN tunneling in channel of the NMOS which is the read transistor 47. This increases the threshold voltage, thereby forming a "1" state.

Next, erase operation in the B bit of the PND cell will be described. Voltages of 8.5V and 0V are applied to an erase gate EG (B) and a control gate CG (B), respectively, in the B bit of the PND cell. At this time, the capacitance ratio between the PMOS of the control gate transistor 49 and the n-type DMOS of the erase gate transistor 50 is designed to be high, so that the floating gate potential is pulled by 0V of the control gate potential and reaches about −0.5V, depending on the amount of electrons accumulated in the floating gate (FG). Accordingly, a high voltage is applied between the floating gate (FG) and the erase gate (EG), which is an n-well, in the n-type DMOS 50, so that electrons accumulated in the floating gate (FG) are emitted from the floating gate (FG) to the erase gate EG (B) which is an n-well terminal of the n-type DMOS 50 by FN tunneling.

Figure 13:
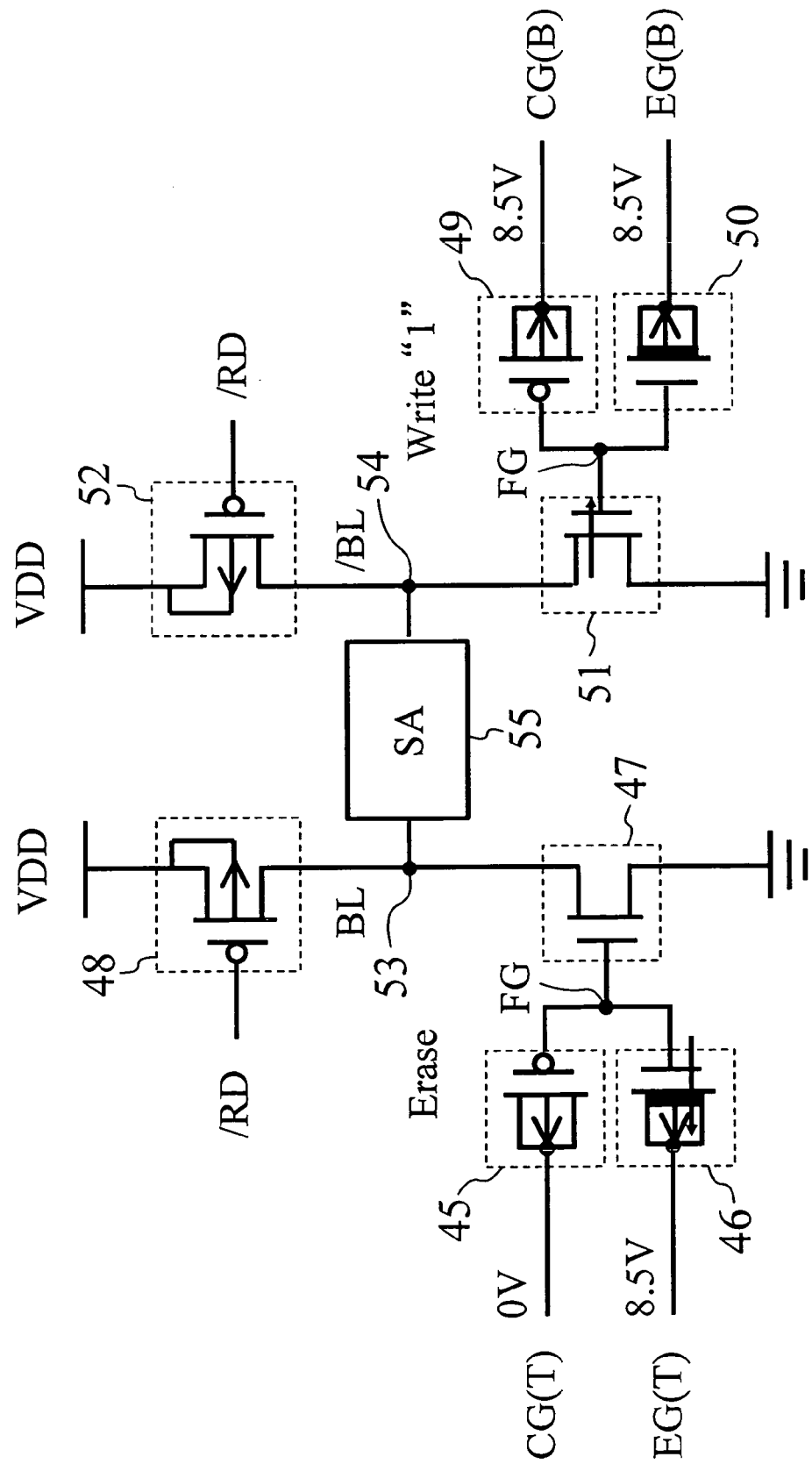
FIG. 13 is a circuit diagram showing write "0" operation of the differential cell structure of the second embodiment.

FIG. 13 is a circuit diagram showing write "0" operation of the differential cell structure of the second embodiment. At this time, VDD is input as a read control signal (/RD) and the load PMOS transistors 48 and 52 are OFF. The bias conditions are the same as those for a case where the T bit and the B bit in write "1" operation are replaced with each other.

Figure 14:
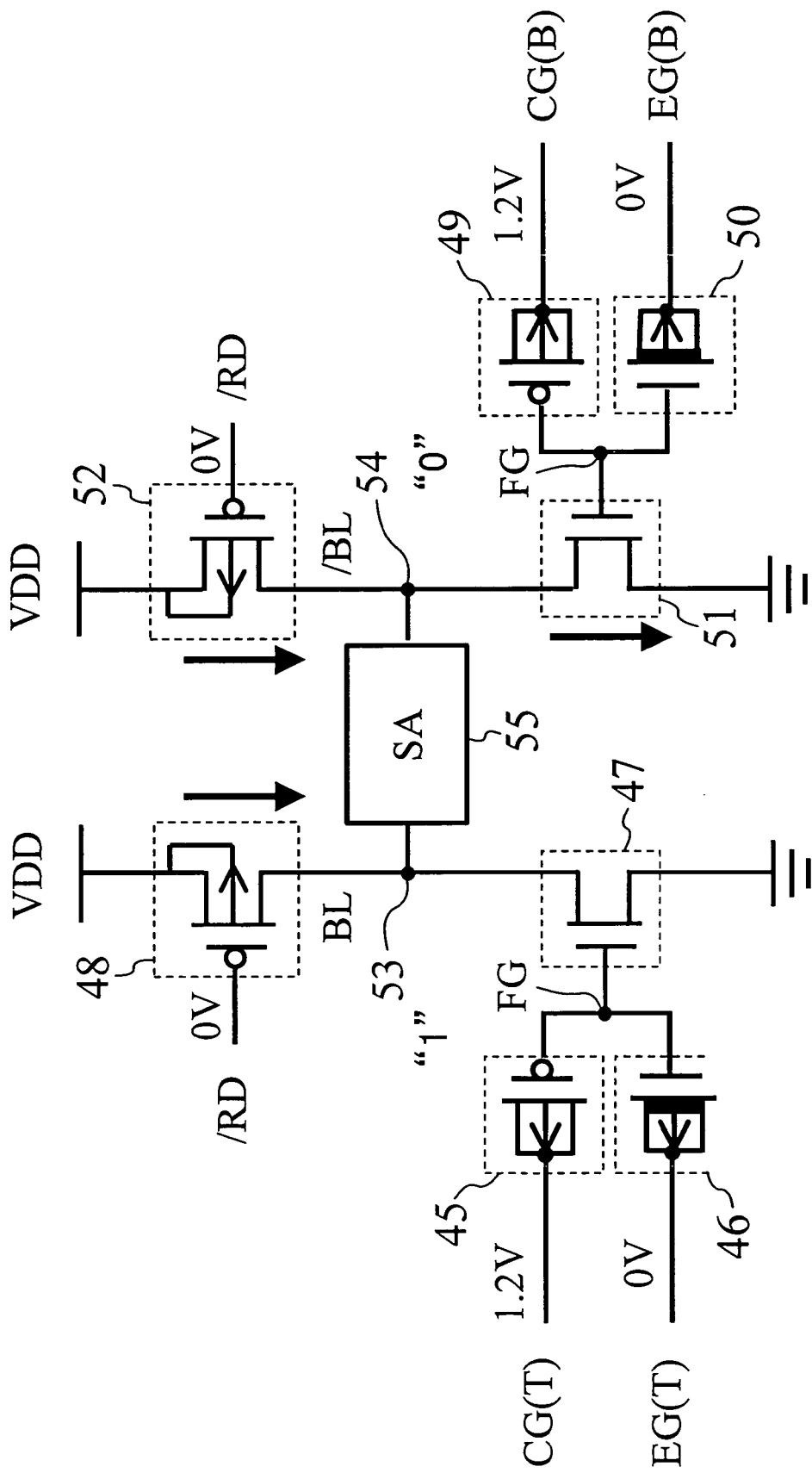
FIG. 14 is a circuit diagram showing read operation of the differential cell structure of the second embodiment.

FIG. 14 is a circuit diagram showing read operation of the differential cell structure of the second embodiment. It is assumed that data "1" and data "0" are written in the T bit and the B bit, respectively, of the differential PND cell. During read operation, 0V is input as a read control signal (/RD) as shown in FIG. 14 and the load PMOS transistors 48 and 52 are ON. In addition, 1.2V and 0V are applied to the control gate CG(T) and the erase gate EG(T), respectively, in the T bit of the PND cell, and 1.2V and 0V are applied to the control gate CG(B) and the erase gate EG(B), respectively, in the B bit of the PND cell. At this time, since the memory cell in the T bit has a high threshold voltage, this memory cell does not turn ON, so that the bit line (BL) 53 changes to VDD. Since the memory cell in the B bit has a low threshold voltage, this memory cell turns ON, so that the bit line bar (/BL) 54 changes to 0V. The BL 53 and the /BL 54 are input to the sense amplifier 55, so that signals are read out after amplification.

Suppose a voltage in the range from 7V to 10V is a first bias and a voltage substantially equal to the power supply voltage of a logic circuit of LSI is a second bias (which is lower than the first bias), the first bias is applied to the control gate CG(T) and the erase gate EG(T) for writing, and the second bias is applied to the control gate CG(T) for erasure, in the T bit of the PND cell, for example.

Embodiment 3

Figure 15:
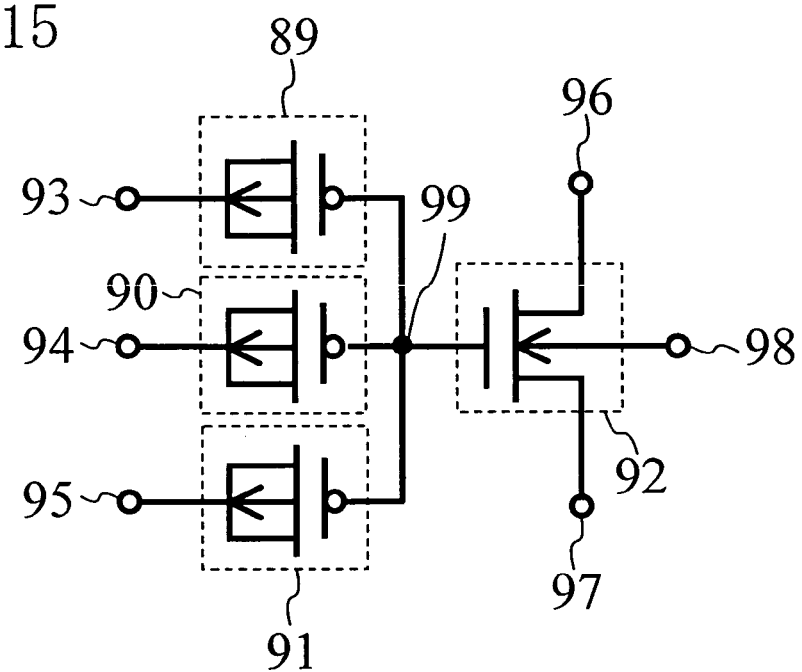
FIG. 15 is a circuit diagram illustrating a nonvolatile memory element according to a third embodiment of the present invention.

FIG. 15 is a circuit diagram illustrating a nonvolatile memory element according to a third embodiment of the present invention. In FIG. 15, reference numeral 89 denotes a program gate transistor (a PMOS transistor), reference numeral 90 denotes a control gate transistor (a PMOS transistor), reference numeral 91 denotes an erase gate transistor (a PMOS transistor), reference numeral 92 denotes a read transistor (an NMOS transistor), reference numeral 93 denotes a program gate (PG), reference numeral 94 denotes a control gate (CG), reference numeral 95 denotes an erase gate (EG), reference numeral 96 denotes a drain terminal of the NMOS read transistor, reference numeral 97 denotes a source terminal of the NMOS read transistor, reference numeral 98 denotes a p-type silicon substrate terminal and reference numeral 99 denotes a floating gate (FG).

Figure 16:
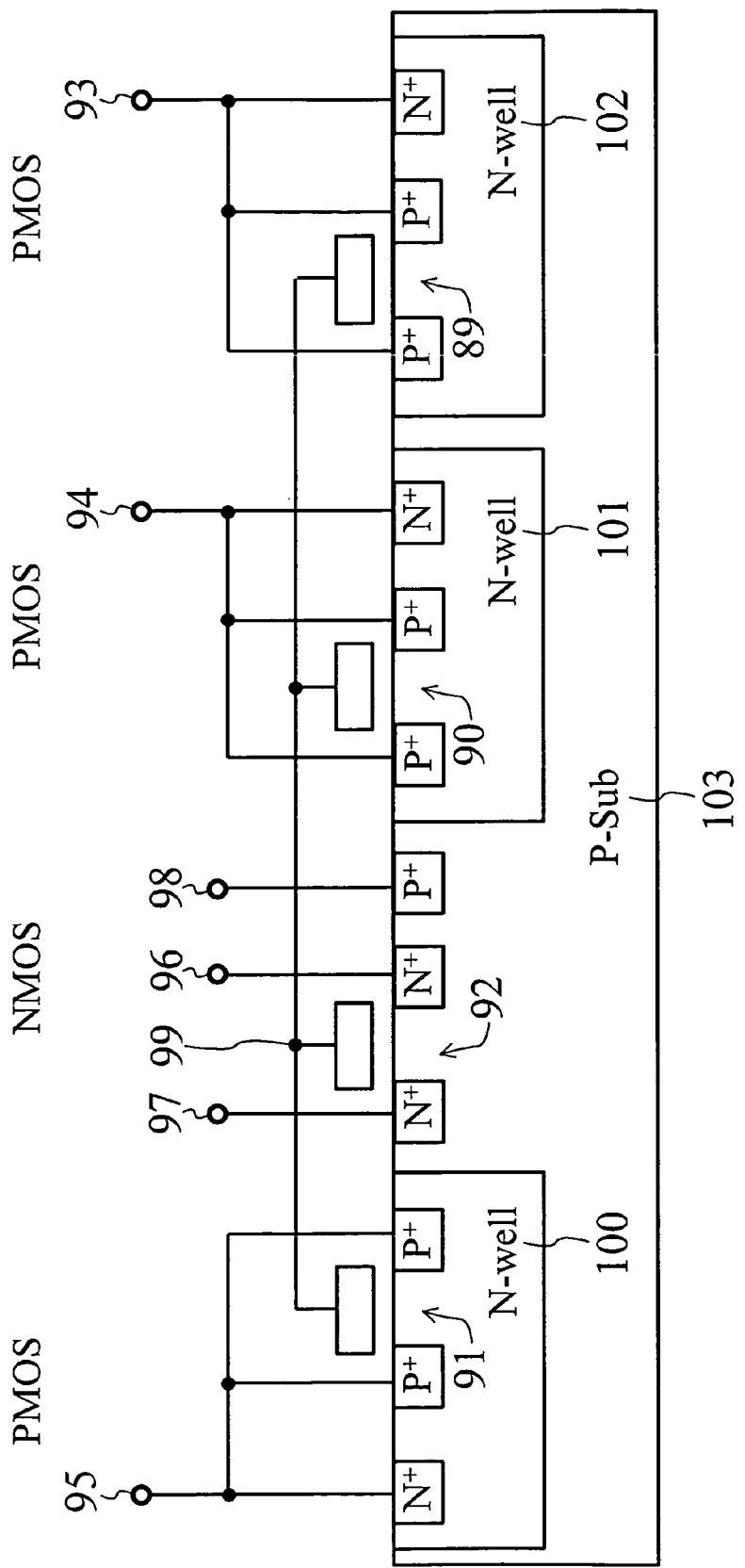
FIG. 16 is a cross-sectional view of the nonvolatile memory element of the third embodiment.

FIG. 16 is a cross-sectional view of the nonvolatile memory element of the third embodiment. In FIG. 16, reference numerals 100, 101 and 102 denote n-well regions and reference numeral 103 denotes a p-type silicon substrate. A four-transistor nonvolatile memory element is configured by adding a program gate as another control gate to a three-transistor nonvolatile memory element.

Write operation is performed by applying a high bias to the program gate (PG) 93, the control gate (CG) 94 and the erase gate (EG) 95 and injecting electrons into the floating gate (FG) 99 by FN tunneling in the NMOS of the read transistor 92. Erase operation is performed by applying 0V to the program gate (PG) 93 and the control gate (CG) 94 and a high bias to the erase gate (EG) 95 to emit electrons by FN tunneling from the floating gate (FG) 99 to the erase gate (EG) 95 in the erase gate transistor 91. Read operation is performed by applying 0V to the program gate (PG) 93 and the erase gate (EG) 95 and a normal voltage to the control gate (CG) 94 to determine whether the read transistor 92 turns ON or not.

With the configuration illustrated in FIG. 15, the threshold voltage in a charge-0 state is determined by the control gate transistor 90 having a capacitance ratio to the read transistor 92 not higher than that of the program gate transistor 89, potentials according to writing and erasure are adjusted using the capacitances of the program gate transistor 89 and the erase gate transistor 91, and the threshold voltage in the charge-0 state (i.e., an ultimate state after reliability deteriorates) is determined simultaneously with high-speed writing and erasure, independently of speed adjustment.

Embodiment 4

Figure 17:
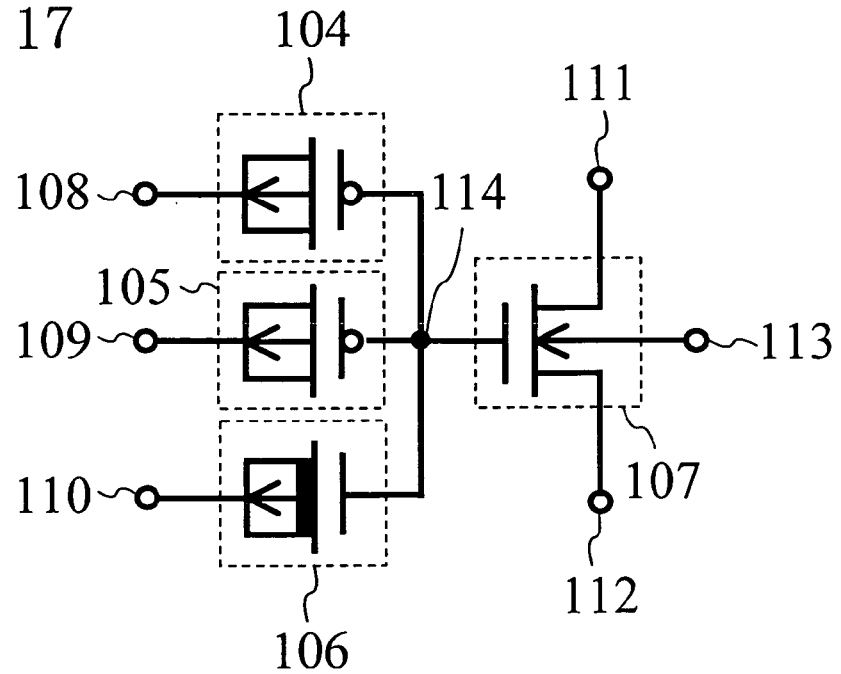
FIG. 17 is a circuit diagram illustrating a nonvolatile memory element according to a fourth embodiment of the present invention.

FIG. 17 is a circuit diagram illustrating a nonvolatile memory element according to a fourth embodiment of the present invention. In FIG. 17, reference numeral 104 denotes a program gate transistor (a PMOS transistor), reference numeral 105 denotes a control gate transistor (a PMOS transistor), reference numeral 106 denotes an erase gate transistor (an n-type DMOS transistor), reference numeral 107 denotes a read transistor (an NMOS transistor), reference numeral 108 denotes a program gate (PG), reference numeral 109 denotes a control gate (CG), reference numeral 110 denotes an erase gate (EG), reference numeral 111 denotes a drain terminal of the NMOS read transistor, reference numeral 112 denotes a source terminal of the NMOS read transistor, reference numeral 113 denotes a p-type silicon substrate terminal and reference numeral 114 denotes a floating gate (FG). Coupling of channel capacitance is used for writing and depletion capacitance is used for erasure, thus increasing the write/erase speed.

Suppose first, second and third biases are V1, V2 and V3, respectively, and V1>V2 and V3>V2. Then, V1 is applied to the program gate (PG) 108 and the control gate (CG) 109 for write operation, V2 is applied to the control gate (CG) 109 for read operation, and V3 is applied to the erase gate (EG) 110 for erase operation.

Embodiment 5

Figure 18:
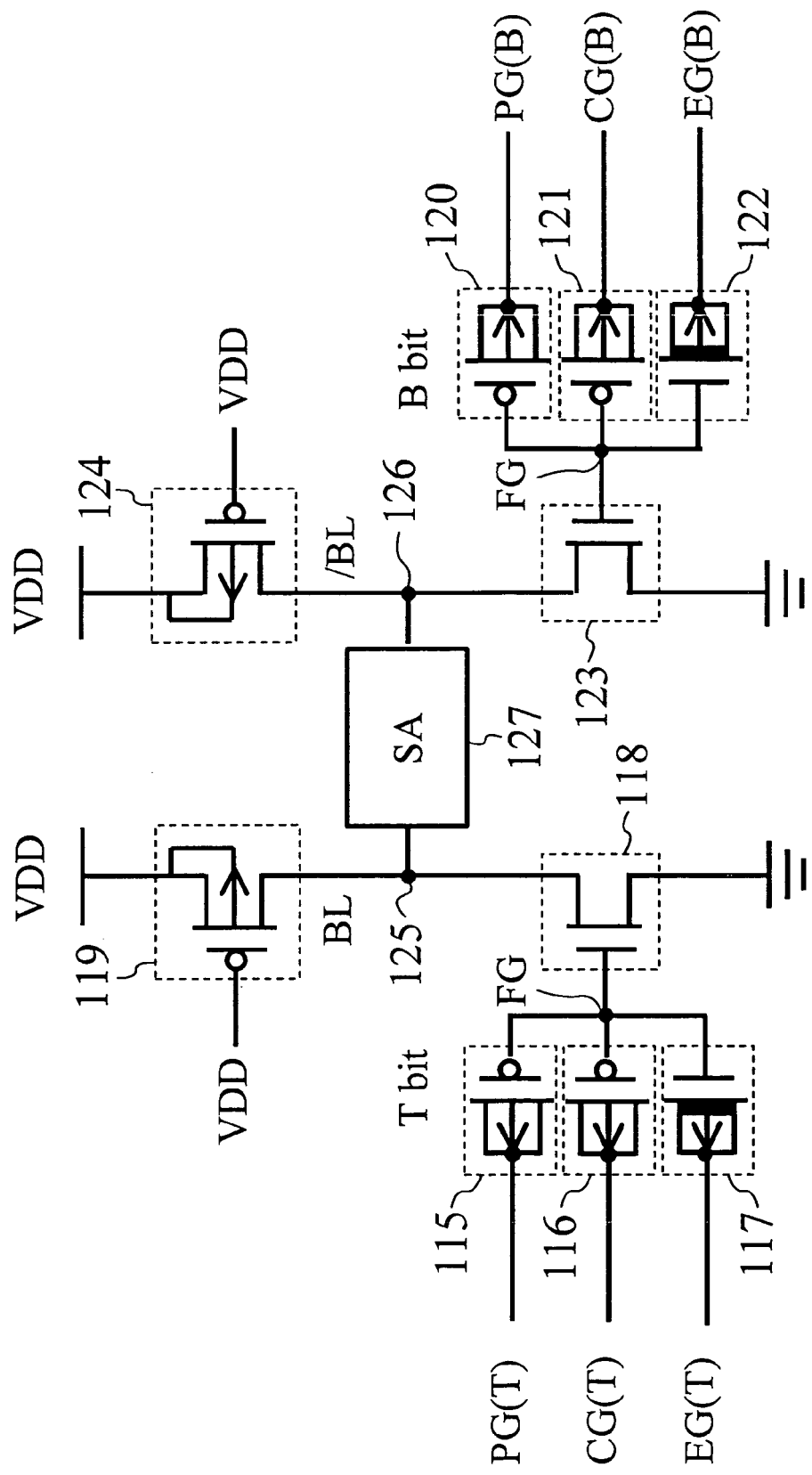
FIG. 18 is a circuit diagram illustrating a nonvolatile semiconductor memory device with a differential cell structure according to a fifth embodiment of the present invention.

FIG. 18 illustrates a nonvolatile semiconductor memory device with a differential cell structure according to a fifth embodiment of the present invention. This differential cell is obtained by modifying the configuration of the fourth embodiment illustrated in FIG. 17 into a differential cell structure. In FIG. 17, reference numeral 115 denotes a program gate transistor (a PMOS transistor) in a T bit, reference numeral 116 denotes a control gate transistor (a PMOS transistor) in the T bit, reference numeral 117 denotes an erase gate transistor (an n-type DMOS transistor) in the T bit, reference numeral 118 denotes a read transistor (an NMOS transistor) in the T bit, reference numerals 119 and 124 denote load PMOS transistors, reference numeral 120 denotes a program gate transistor (a PMOS transistor) in a B bit, reference numeral 121 denotes a control gate transistor (a PMOS transistor) in the B bit, reference numeral 122 denotes an erase gate transistor (an n-type DMOS transistor) in the B bit, reference numeral 123 denotes a read transistor (an NMOS transistor) in the B bit, reference numeral 125 denotes a bit line (BL), reference numeral 126 denotes a bit line bar (/BL) and reference numeral 127 denotes a sense amplifier.

In the fifth embodiment, the nonvolatile memory cell of the fourth embodiment is modified to have a differential cell structure, so that the threshold voltage in a charge-0 state at which high reliability of the differential cell is maintained is determined independently of speed adjustment, thus implementing a nonvolatile semiconductor memory device exhibiting excellent data retention characteristics with advantages of a differential amplifying cell utilized.

Each of the nonvolatile semiconductor memory devices of the foregoing embodiments is constituted by MOS transistors formed by the same process as that of MOS transistors forming an input/output circuit of LSI, thus implementing a low-cost nonvolatile semiconductor memory device. Specifically, the thickness of gate oxide films of MOS transistors forming a nonvolatile memory cell is substantially equal to the thickness of gate oxide films of MOS transistors forming an input/output circuit of LSI, i.e., is 7 nm to 8 nm.

A nonvolatile semiconductor memory device according to the present invention is a low-cost nonvolatile semiconductor memory device capable of being embedded in LSI in a leading-edge standard CMOS process and is useful for circuit trimming and application for implementation of information such as secure data.

What is claimed is:

1. A nonvolatile semiconductor memory device for storing data by accumulating charge in a floating gate, comprising a plurality of MOS transistors sharing the floating gate,
    wherein the MOS transistors include:
    a first MOS transistor formed in an n-well region, one of a source and a drain of the first MOS transistor being formed by a p-type diffusion layer; and
    a second MOS transistor formed in an n-well region, one of a source and a drain of the second MOS transistor being formed by an n-type diffusion layer.

2. The nonvolatile semiconductor memory device of claim 1, wherein the second MOS transistor is a depletion MOS transistor.

3. The nonvolatile semiconductor memory device of claim 2, wherein the second MOS transistor and the first MOS transistor have a gate area ratio of substantially 1:9.

4. The nonvolatile semiconductor memory device of claim 1, wherein the MOS transistors further include a third MOS transistor sharing the floating gate, and
    data read operation is performed using a current value of the third MOS transistor.

5. The nonvolatile semiconductor memory device of claim 4, wherein the second MOS transistor and the third MOS transistor have a gate area ratio of substantially 1:2 to 4.

6. The nonvolatile semiconductor memory device of claim 4, wherein the third MOS transistor and the first MOS transistor have a gate area ratio of substantially 1:2 to 4.

7. The nonvolatile semiconductor memory device of claim 4, wherein the second MOS transistor, the third MOS transistor and the first MOS transistor have a gate area ratio of substantially 1:3:9.

8. A nonvolatile semiconductor memory device formed by modifying the nonvolatile semiconductor memory device of claim 4 into a differential cell structure, wherein drains of the third MOS transistors in a first bit cell and a second bit cell are connected to inputs of a differential amplifier.

9. The nonvolatile semiconductor memory device of claim 4, wherein the first, second and third MOS transistors have a gate-oxide-film thickness substantially equal to that of a MOS transistor forming an input/output circuit of LSI.

10. The nonvolatile semiconductor memory device of claim 4, wherein the first, second and third MOS transistors have a gate-oxide-film thickness ranging from 7 nm to 8 nm.

11. The nonvolatile semiconductor memory device of claim 1, wherein a first bias is applied to one of a p-type source and a p-type drain of the first MOS transistor and one of an n-type source and an n-type drain of the second MOS transistor for writing,
    a second bias is applied to one of a p-type source and a p-type drain of the first MOS transistor for erasure, and
    the first bias is higher than the second bias.

12. The nonvolatile semiconductor memory device of claim 11, wherein the first bias is in the range from 7V to 10V.

13. The nonvolatile semiconductor memory device of claim 11, wherein the second bias is substantially equal to a power supply voltage of a logic circuit of LSI.

14. A nonvolatile semiconductor memory device for storing data by accumulating charge in a floating gate, the nonvolatile semiconductor memory device comprising a plurality of MOS transistors sharing the floating gate,
    wherein the MOS transistors include:
    a first MOS transistor formed in an n-well region, one of a source and a drain of the first MOS transistor being formed by a p-type diffusion layer;
    a second MOS transistor formed in an n-well region, one of a source and a drain of the second MOS transistor being formed by a p-type diffusion layer;
    a third MOS transistor formed in an n-well region, one of a source and a drain of the third MOS transistor being formed by an n-type diffusion layer; and
    a fourth MOS transistor formed by an NMOS.

15. The nonvolatile semiconductor memory device of claim 14, wherein a first bias is applied to the n-well regions of the first and second MOS transistors for write operation,
    a second bias is applied to the n-well region of the second MOS transistor for read operation,
    a third bias is applied to the n-well region of the third MOS transistor for erase operation, and
    each of the first and third biases is higher than the second bias.

16. A nonvolatile semiconductor memory device formed by modifying the nonvolatile semiconductor memory device of claim 14 into a differential cell structure, wherein drains of the fourth MOS transistors in a first bit cell and a second bit cell are connected to inputs of a differential amplifier.

17. The nonvolatile semiconductor memory device of claim 14, wherein the first, second, third and fourth MOS transistors have a gate-oxide-film thickness substantially equal to that of a MOS transistor forming an input/output circuit of LSI.

* * * * *

UNITED STATES PATENT AND TRADEMARK OFFICE
CERTIFICATE OF CORRECTION

| | |
|---|---|
| PATENT NO. | : 7,623,380 B2 |
| APPLICATION NO. | : 11/526057 |
| DATED | : November 24, 2009 |
| INVENTOR(S) | : Yamamoto et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 455 days.

Signed and Sealed this

Twenty-sixth Day of October, 2010

David J. Kappos
*Director of the United States Patent and Trademark Office*